(12) United States Patent
Kojima

(10) Patent No.: US 12,471,388 B2
(45) Date of Patent: Nov. 11, 2025

(54) SEMICONDUCTOR DEVICE

(71) Applicant: Socionext Inc., Kanagawa (JP)

(72) Inventor: Masayoshi Kojima, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 441 days.

(21) Appl. No.: 18/105,477

(22) Filed: Feb. 3, 2023

(65) Prior Publication Data

US 2023/0260987 A1     Aug. 17, 2023

(30) Foreign Application Priority Data

Feb. 16, 2022 (JP) ................. 2022-022409

(51) Int. Cl.
*H10D 89/60* (2025.01)
(52) U.S. Cl.
CPC ......... *H10D 89/819* (2025.01); *H10D 89/921* (2025.01)
(58) Field of Classification Search
CPC ...... H10D 89/819; H10D 89/921; H02H 9/00; H02H 7/205; H02M 7/537
USPC .......................................................... 361/56
See application file for complete search history.

(56) References Cited

U.S. PATENT DOCUMENTS

| | | | | |
|---|---|---|---|---|
| 6,556,398 B1 * | 4/2003 | Chen | ..................... | H10D 89/601 361/111 |
| 7,593,204 B1 * | 9/2009 | Iversen | ................. | H02H 9/046 361/56 |
| 10,535,647 B2 | 1/2020 | Chen et al. | | |
| 11,056,880 B1 | 7/2021 | Mathur et al. | | |
| 2006/0092590 A1 * | 5/2006 | Chuang | ................ | H10D 89/819 361/91.1 |
| 2014/0307354 A1 | 10/2014 | Watanabe | | |
| 2014/0368958 A1 * | 12/2014 | Ikimura | ................. | H02H 9/046 361/56 |

* cited by examiner

*Primary Examiner* — Kevin J Comber
(74) *Attorney, Agent, or Firm* — Rimon P.C.

(57) ABSTRACT

A semiconductor device includes: an ESD protection circuit including a first n-channel MOS transistor provided between a signal terminal and a ground wire; and a control circuit electrically connected to the signal terminal, wherein, while a signal of a high level is being supplied to the signal terminal, the control circuit outputs a first voltage dropped from a high-level voltage of the signal to a gate of the first n-channel MOS transistor, and in response to a surge due to ESD being input into the signal terminal, outputs a second voltage lower than the first voltage to the gate of the first n-channel MOS transistor.

6 Claims, 5 Drawing Sheets

SEMICONDUCTOR DEVICE

CROSS-REFERENCE TO RELATED APPLICATIONS

The present application is based upon and claims the benefit of priority under 35 U.S.C. § 119 of Japanese Patent Application No. 2022-022409 filed on Feb. 16, 2022, the entire contents of which are hereby incorporated by reference.

TECHNICAL FIELD

The present disclosure relates to a semiconductor device.

BACKGROUND ART

In order to protect internal circuits of semiconductor devices from electro-static discharge (ESD), ESD protection circuits that are installed in semiconductor devices have been known. For example, such an ESD protection circuit includes transistors arranged between an external terminal and a ground wire, and a control circuit that increases the gate voltage of the transistors of the ESD protection circuit in response to an ESD event applied to the external terminal. This type of ESD protection circuit includes, in some cases, an RC circuit that generates a control voltage in response to an ESD event.

RELATED ART DOCUMENTS

Patent Documents

[Patent Document 1] U.S. patent Ser. No. 11/056,880
[Patent Document 2] U.S. Patent Application Publication No. 2014/0307354
[Patent Document 3] U.S. patent Ser. No. 10/535,647

In recent years, as finer microfabrication of semiconductor elements including transistors and reduction in power in semiconductor devices progress, the withstand voltage of elements including transistors and the like installed in the semiconductor devices is decreasing. For example, in the case of using a low withstand voltage type transistor in an ESD protection circuit, it is necessary to control the gate voltage so as to improve the capability of the ESD protection circuit while suppressing breakdown of the transistors.

SUMMARY

According to an aspect in the present disclosure, a semiconductor device includes: an ESD protection circuit including a first n-channel MOS transistor provided between a signal terminal and a ground wire; and a control circuit electrically connected to the signal terminal, wherein, while a signal of a high level is being supplied to the signal terminal, the control circuit outputs a first voltage dropped from a high-level voltage of the signal to a gate of the first n-channel MOS transistor, and in response to a surge due to ESD being input into the signal terminal, outputs a second voltage lower than the first voltage to the gate of the first n-channel MOS transistor.

EMBODIMENTS OF THE INVENTION

Figure 1:
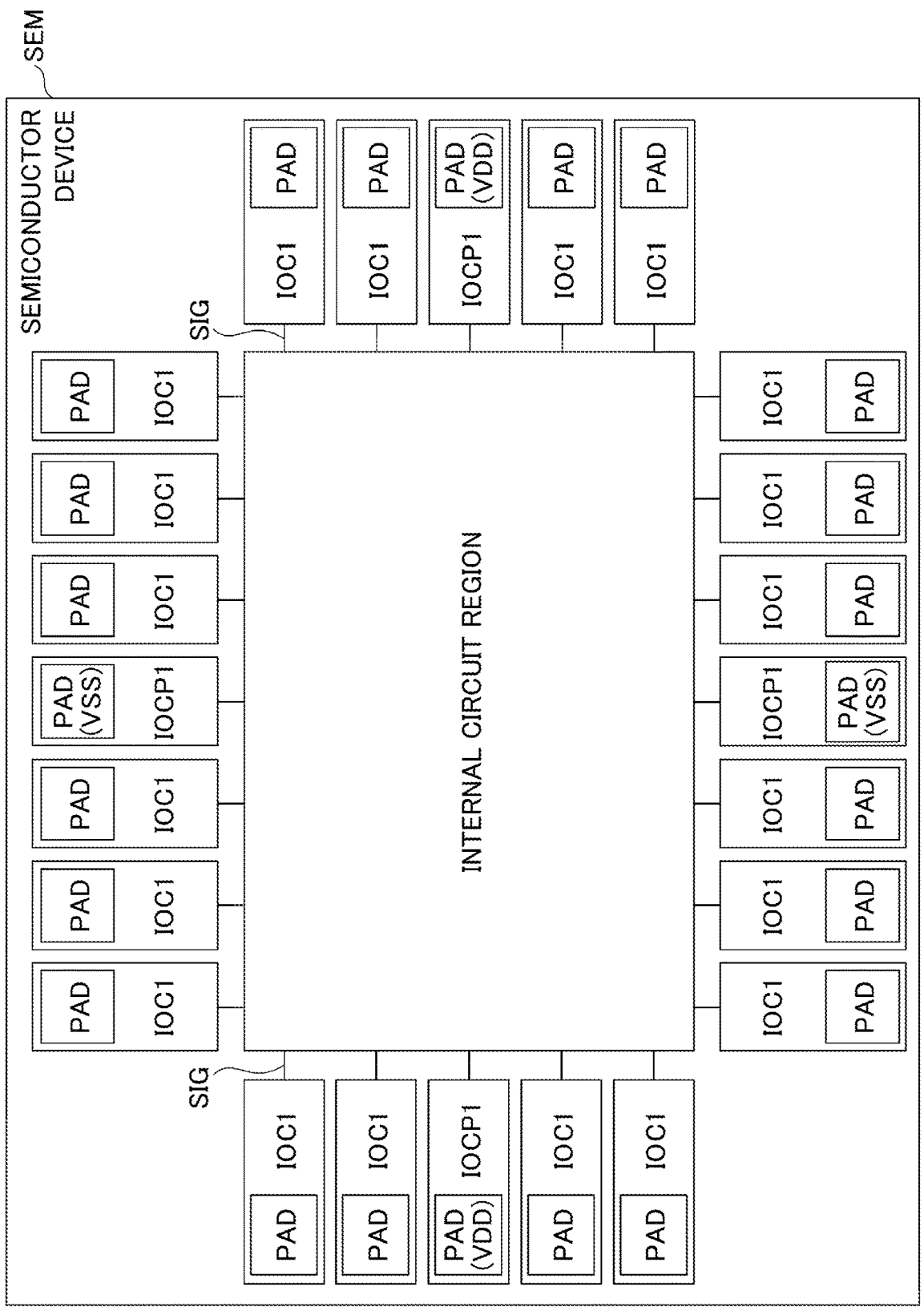
FIG. 1 illustrates an example of a layout of a semiconductor device according to a first embodiment.

In the following, embodiments will be described with reference to the drawings. In the following, a reference numeral indicating a signal is also used as a reference numeral indicating a signal value, a signal line, or a signal terminal. A reference numeral indicating a voltage is also used as a reference numeral indicating a voltage line or a voltage terminal to which the voltage is supplied.

According to the disclosed techniques, the capability of an ESD protection circuit can be improved while suppressing breakdown of a transistor, even in the case where a low withstand voltage type transistor is provided in an ESD protection circuit.

First Embodiment

FIG. 1 illustrates an example of a layout of a semiconductor device according to a first embodiment. For example, a semiconductor device SEM illustrated in FIG. 1 may be an SoC (System on Chip), or may be a single CPU (Central Processing Unit), GPU (Graphics Processing Unit), DSP (Digital Signal Processor), FPGA (Field-Programmable Gate Array), or memory.

The semiconductor device SEM includes multiple I/O cells IOC1 and IOCP1, each of which includes a pad PAD. The I/O cell IOC1 is an interface circuit for a signal SIG such as an input signal, an output signal, or an input/output signal. The I/O cell IOCP1 is an interface circuit for a power supply voltage VDD or a ground voltage. The pad PAD provided in the I/O cell IOC1 is an example of a signal terminal.

Each of the I/O cells IOC1 and IOCP1 is connected to an internal circuit region. For example, in the internal circuit region, a logic circuit may be installed, or a memory may be installed. In addition, in the internal circuit region, an analog circuit may be installed. In FIG. 1, although the semiconductor device SEM includes one internal circuit region, the number of internal circuit regions may be two or more.

Note that the number of I/O cells IOC1 and IOCP1 is not limited to the example illustrated in FIG. 1. The number of pads PAD for signals SIG; the number of pads PAD for the power supply voltage VDD; the number of pads PAD for the ground voltage VSS; and the ratio between these numbers are also not limited to the example illustrated in FIG. 1. In addition, in FIG. 1, in order to make the illustration easier to understand, an example is shown in which pads PAD are provided at the outer periphery of the semiconductor device SEM; however, the positions of the pads PAD may be provided at any positions in the semiconductor device SEM. Further, the pads PAD may be provided on the side (back side) opposite to an element surface on which the I/O cells IOC1 and IOCP1 are formed. To the pads PAD, bonding wires may be connected, or bumps may be connected.

Figure 2:
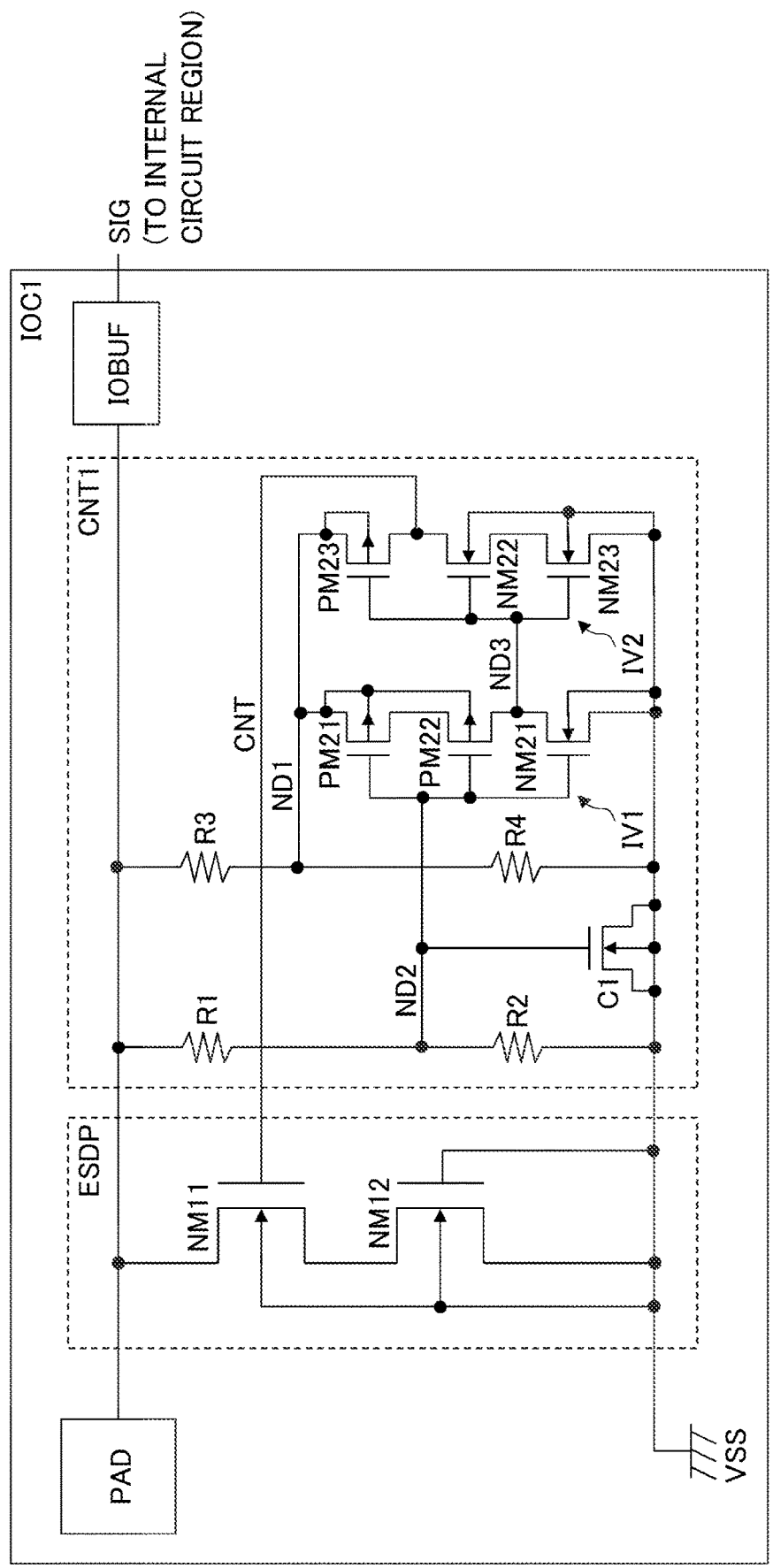
FIG. 2 is a circuit diagram illustrating an example of an I/O cell for a signal in FIG. 1.

FIG. 2 illustrates an example of the I/O cell IOC1 for a signal SIG in FIG. 1. In addition to the pad PAD, the I/O cell IOC1 includes a protection circuit ESDP for ESD, a control circuit CNT1, and an input/output circuit IOBUF. The input/output circuit IOBUF includes, for example, an input buffer to receive a signal supplied to the pad PAD, an output buffer to output a signal to the pad PAD, or an input buffer and an output buffer. Note that although illustration is omitted, the I/O cell IOCP1 illustrated in FIG. 1 includes a protection circuit for ESD provided between a power supply wire VDD and a ground wire VSS.

The protection circuit ESDP includes n-channel metal oxide semiconductor (MOS) transistors NM11 and NM12 connected in series between the pad PAD and the ground wire VSS. The drain of the n-channel MOS transistor NM11 is connected to the pad PAD. The source of the n-channel MOS transistor NM11 is connected to the drain of the n-channel MOS transistor NM12. The source and the gate of the re-channel MOS transistor NM12 are connected to the ground wire VSS.

In the following, n-channel MOS transistors and p-channel MOS transistors may also be simply referred to as transistors. An n-channel MOS transistor is indicated with a reference numeral prefixed with "NM", and a p-channel MOS transistor is indicated with a reference numeral prefixed with "PM".

The gate of the transistor NM11 receives a control signal CNT output from the control circuit CNT1. The back gates (p-type well regions) of the transistors NM11 and NM12 are connected to the ground wire VSS.

For example, transistors used in the internal circuit region and the I/O cells IOC1 and IOCP1 are of a low withstand voltage type. Note that the input buffer and the output buffer arranged in the input/output circuit IOBUF are designed to have a withstand voltage higher than that of the low withstand voltage type, in accordance with a high-level voltage of a signal supplied to the pad PAD.

For example, the withstand voltage of the low withstand voltage type transistor is lower than the high-level voltage of a signal input into or output from the I/O cell IOC1. Therefore, the voltage between the gate and the drain of the n-channel MOS transistor NM11 connected to the pad PAD in the protection circuit ESDP needs to be set lower than or equal to the withstand voltage of the re-channel MOS transistor NM11 while a signal of the high level is being supplied to the pad PAD. Although not limited in particular, for example, the high-level voltage of a signal supplied to the pad PAD is 1.8 V, and the withstand voltage of the n-channel MOS transistor NM11 is 1.2 V.

The control circuit CNT1 includes resistive elements R1, R2, R3, and R4, a capacitive element C1, transistors PM21, PM22, and PM23, and transistors NM21, NM22, and NM23. The resistive elements R1 and R2 are connected in series via a node ND2, between the pad PAD and the ground wire VSS. The resistive elements R3 and R4 are connected in series via a node ND1, between the pad PAD and the ground wire VSS. Although not limited in particular, the withstand voltage of transistors PM21 to PM23 and NM21 to NM23 is, for example, 1.2 V.

Note that a diode may be arranged in series instead of the resistive element R3. In this case, for example, the anode of the diode is connected to the pad PAD, and the cathode of the diode is connected to the node ND1. Further, multiple diodes may be connected in series between the pad PAD and the node ND1.

The capacitive element C1 is connected between the node ND2 and the ground wire VSS. Although not limited in particular, the capacitive element C1 is formed, for example, by using the gate insulator film of an n-channel MOS transistor having its gate connected to the node ND2, and its source, drain, and back gate connected to the ground wire VSS. The resistive element R1 and the capacitive element C1 function as an RC circuit.

The transistors PM21, PM22, and NM21 are connected in series between the node ND1 and the ground wire VSS, to operate as an inverter EV1. The transistors PM23, NM22, and NM23 are connected in series between the node ND1 and the ground wire VSS, to operate as an inverter IV2. The back gates of the transistors PM21, PM22, and PM23 are connected to the node ND1. The back gates of the transistors NM21, NM22, and NM23 are connected to the ground wire VSS.

The input of the inverter IV1 is connected to the node ND2, and the node ND3 as the output of the inverter IV1 is connected to the input of the inverter IV2. The output of the inverter IV2 is connected to the gate of the transistor NM11 via a control signal line CNT. The output of the inverter IV2 is an example of an output terminal.

In the following, operations of the I/O cell IOC1 when a signal SIG of the high level is supplied to the pad PAD, and operations of the I/O cell IOC1 when a surge due to ESD is input into the pad PAD will be described. Here, the high level is used to mean a level of logic one (among binary values of one and zero) and the high-level voltage. In addition, the low level is used to mean a level of logic zero and the low-level voltage (ground voltage VSS). In the following, a surge due to ESD being input to the pad PAD is also referred to as an occurrence of an ESD event.

A state of the pad PAD being supplied with a signal SIG of the high level occurs, for example, during operations of a system after the semiconductor device SEM has been built into the system. When a signal SIG of the high level is supplied to the pad PAD, the node ND2 is set to a voltage obtained by dividing the high level by the resistive elements R1 and R2. Similarly, the node ND1 is set to a voltage obtained by dividing the high level by the resistive elements R3 and R4.

For example, in the case where the resistance values of the resistive elements R1 and R3 are equal to each other, and the resistance values of the resistive elements R2 and R4 are equal to each other, the voltages of the node ND1 and the node ND2 are equal to each other. The division ratio by the resistive elements R1 and R2 and the division ratio by the resistive elements R3 and R4 are designed such that the voltages of the nodes ND1 and ND2 when a signal SIG of the high level is supplied to the pad PAD is lower than or equal to the withstand voltages of the transistors in the control circuit CNT1. Accordingly, breakdown of the transistors PM21 to PM23 and NM21 to NM23 of the inverters IV1 and IV2, and the transistor NM11 of the protection circuit ESDP can be suppressed when a signal SIG of the high level is supplied to the pad PAD.

The inverter IV1 outputs the low level to the node ND3 while receiving the high level of the node ND2 at the input. The inverter IV2 outputs the high level as the control signal CNT while receiving the low level of the node ND3 at the input. The control signal CNT of the high level is supplied to the gate of the transistor NM11 of the protection circuit ESDP. The drain of the transistor NM11 is supplied with the high level of the signal SIG.

Accordingly, the voltage between the drain and the gate of the transistor NM11 can be set to be lower than or equal to the withstand voltage of the transistor NM11 of the low withstand voltage type. As a result, when a signal SIG of the high level is supplied to the pad PAD, occurrence of withstand voltage violation in the transistor NM11 can be suppressed, and breakdown of the transistor NM11 can be suppressed.

Note that when the gate of the transistor NM11 is supplied with the control signal CNT corresponding to the high level of the node ND1, the resistance between the source and the drain of the transistor NM11 decreases. However, as the transistor NM12 is maintained to be in an off state, when a signal SIG of the high level is input into the pad PAD, a through current can be prevented from flowing between the pad PAD and the ground wire VSS in the protection circuit ESDP.

In contrast, when a signal SIG of the high level is supplied to the pad PAD, in the case where the gate of the transistor NM11 is set to the low level, the voltage between the drain and the gate of the transistor NM11 is set to the high-level voltage of the control signal CNT that exceeds the withstand voltage of the transistor NM11. In this case, the transistor NM11 may be broken down.

Note that operations when a signal SIG of the high level output from the internal circuit region is output from the pad PAD to the outside of the semiconductor device SEM, are substantially the same as the operations when a signal SIG of the high level is input into the pad PAD.

Meanwhile, an ESD event occurs, for example, at a step of manufacturing the semiconductor device SEM or a step of assembling a system into which the semiconductor device SEM is built. For example, in the case where a pad PAD comes into contact with an electrified jig or the like, and a positive surge is input into the pad PAD, an ESD current flows from the pad PAD to the ground wire VSS due to a bipolar operation of the transistor NM11 of the protection circuit ESDP. Accordingly, the ESD current can be suppressed from flowing in the internal circuit region, and elements including transistors and the like installed in the internal circuit region can be protected from the surge.

In addition, in the case where a positive surge is input into the pad PAD, the time constant of the RC circuit by the resistive element R1 and the capacitive element C1 maintains the node ND2 at the low level (ground voltage VSS). Note that the RC circuit is designed to have a time constant with which the node ND2 is set to the low level while a positive surge is input into the pad PAD.

The node ND1 is set to substantially the same voltage as when a signal SIG of the high level is input into the pad PAD. Therefore, the inverter IV1 outputs the high level to the node ND3 in response to the low level of the node ND1. The inverter IV2 outputs the control signal CNT of the low level in response to the high level of the node ND3 to the gate of the transistor NM11. By setting the gate of the transistor NM11 to the low level when an ESD event occurs, the capability of the bipolar operation can be increased compared to the case of setting the gate of the transistor NM11 to the high level.

Here, as the node ND1 and the node ND2 are electrically separated via the resistive elements R1 and R3, the node ND1 can be suppressed from becoming the low level together with the node ND2 when an ESD event occurs. Therefore, when an ESD event occurs, the inverters IV1 and IV2 can operate while receiving the normal power supply voltage, and can generate a control signal CNT of the low level.

Note that when a signal SIG of the low level is supplied to the pad PAD, or in the case of the pad PAD in an open state, the node ND1 and the node ND2 are set to the low level, and the control signal CNT is set to the low level. Therefore, the voltage between the drain and the gate of the transistor NM11 of the protection circuit ESDP becomes 0 V, and the transistor NM11 is not broken down.

In addition, in the case where a negative surge is input into the pad PAD, a current due to a parasitic diode flows from the back gate (p-type well layer) to the drain (n-type diffusion layer) of the transistor NM11 of the protection circuit ESDP. Accordingly, an ESD current is suppressed from flowing from the internal circuit region to the pad PAD, and the elements such as the transistors installed in the internal circuit region are protected. When a negative surge is input into the pad PAD, the control circuit CNT1 does not operate.

As above, in this embodiment, when a signal SIG of the high level is input into the pad PAD, the control circuit CNT1 outputs a control signal CNT of the high level to the gate of the transistor NM11 of the protection circuit ESDP. Accordingly, when a signal SIG of the high level is input into the pad PAD, occurrence of withstand voltage violation in the transistor NM11 can be suppressed, and breakdown of the transistor NM11 can be suppressed. In other words, even in the case where the protection circuit ESDP is provided with a transistor NM11 of the low withstand voltage type, breakdown of the transistor NM11 can be suppressed.

In the control circuit CNT1, to the node ND2 as the input of the inverter IV1, a voltage dropped from the high-level voltage of the signal SIG is supplied. Similarly, to the node ND1 as the power terminal of the inverters EV1 and IV2, a voltage dropped from the high-level voltage of the signal SIG is supplied. Accordingly, when a signal SIG of the high level is supplied to the pad PAD, breakdown of the transistors PM21 to PM23 and NM21 to NM23 of the inverters EV1 and IV2 can be suppressed.

In addition, in the case where a positive surge is input into the pad PAD, an ESD current flows from the pad PAD to the ground wire VSS due to a bipolar operation of the transistor NM11 of the protection circuit ESDP. Accordingly, the ESD current can be suppressed from flowing in the internal circuit region, and elements including transistors and the like installed in the internal circuit region can be protected from the surge. Further, by setting the gate of the transistor NM11 to the low level when an ESD event occurs, the capability of the bipolar operation can be increased compared to the case of setting the gate of the transistor NM11 to the high level.

Second Embodiment

Figure 3:
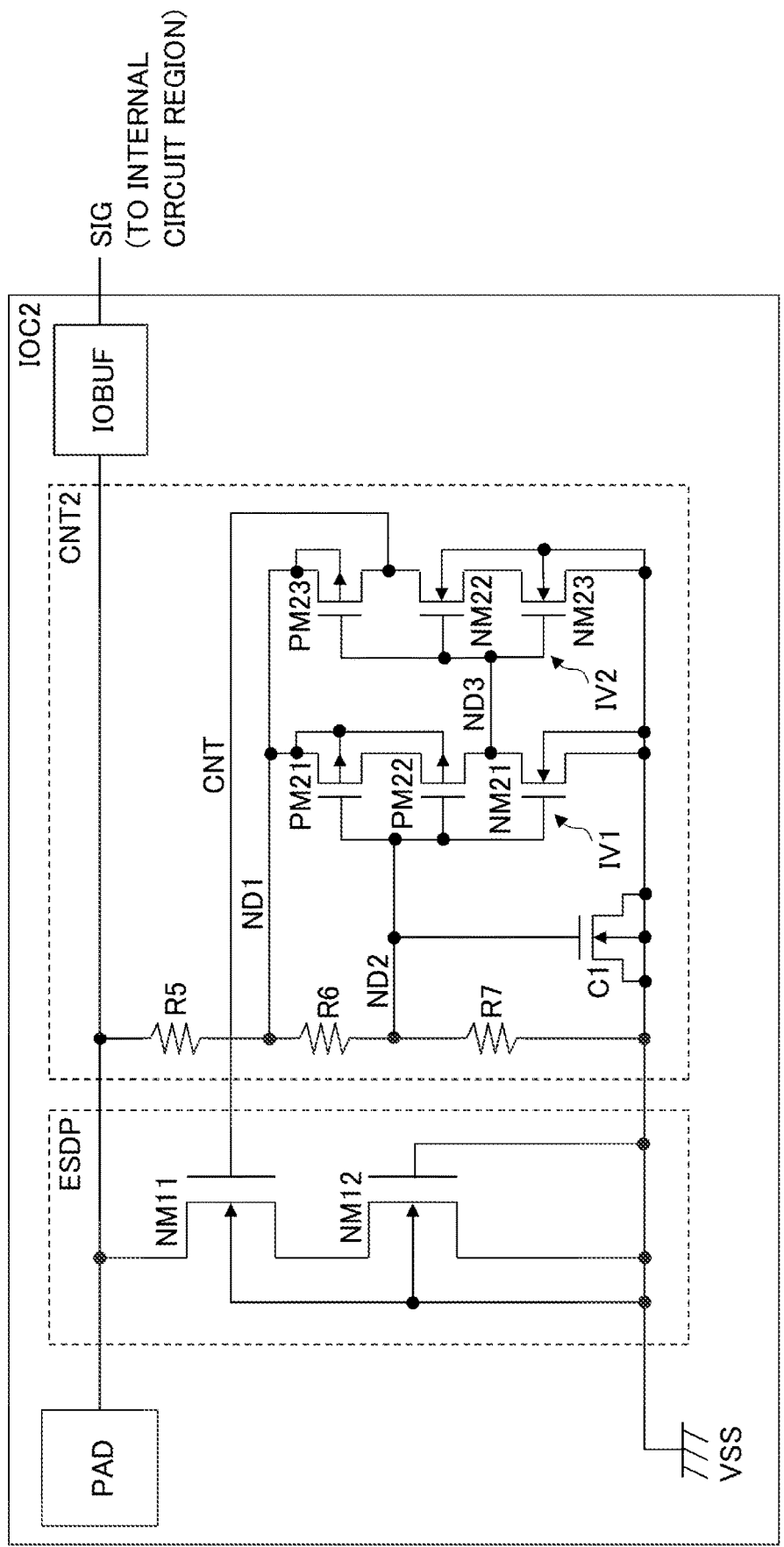
FIG. 3 is a circuit diagram illustrating an example of an I/O cell for a signal in a semiconductor device according to a second embodiment.

FIG. 3 illustrates an example of an I/O cell for a signal in a semiconductor device according to a second embodiment. Elements substantially the same as those in FIG. 2 are assigned the same reference numerals, and detailed descriptions will be omitted. An I/O cell IOC2 for a signal SIG illustrated in FIG. 3 has substantially the same configuration as the I/O cell in FIG. 2, except that IOC2 includes a control circuit CNT2 instead of the control circuit CNT1. The I/O cell IOC2 is installed in a semiconductor device SEM instead of the I/O cell IOC1 in FIG. 1.

The I/O cell IOC2 has substantially the same configuration as the control circuit CNT1 in FIG. 2, except that IOC2 includes resistive elements R5, R6, and R7 instead of the resistive elements R1 to R4. The resistive elements R5, R6, and R7 are connected in series via the nodes ND1 and then ND2, between the pad PAD and the ground wire VSS. The resistive elements R5 and R6 and the capacitive element C1 function as an RC circuit.

The number of the resistive elements R5 to R7 included in the I/O cell IOC2 is less than the number of the resistive elements R1 to R4 included in the I/O cell IOC1 in FIG. 2.

Therefore, the size of the I/O cell IOC2 can be made smaller than the size of the I/O cell IOC1.

Operations of the I/O cell IOC2 when a signal SIG of the high level is supplied to the pad PAD are substantially the same as the operations of the I/O cell IOC1 in FIG. 2. The operations of the I/O cell IOC2 when a surge due to ESD is input into the pad PAD are substantially the same as the operations of the I/O cell IOC1 in FIG. 2.

As above, also in this embodiment, the same effects as in the embodiment described above can be obtained. For example, when a signal SIG of the high level is input into the pad PAD, the control circuit CNT2 outputs the high-level control signal CNT, and hence, no withstand voltage violation occurs in the transistor NM11, and breakdown of the transistor NM11 can be suppressed. As the node ND1 and the node ND2 of the control circuit CNT2 are set to voltages that are dropped from the high-level voltage of the signal SIG, breakdown of the transistors PM21 to PM23 and NM21 to NM23 by the signal SIG of the high level can be suppressed.

Further, in this embodiment, the number of the resistive elements included in the I/O cell IOC2 can be designed to be less than the number of the resistive elements included in the I/O cell IOC1 in FIG. 2. As a result, the size of the I/O cell IOC2 can be made smaller than the size of the I/O cell IOC1.

As many I/O cells IOC2 are provided as the number of pads PAD to which the signals SIG are input or output, the effect of chip size reduction of the semiconductor device SEM is significant. In the case where the chip size of the semiconductor device SEM is not reduced, the number of elements including transistors and the like that can be installed in the internal circuit region can be increased.

Third Embodiment

Figure 4:
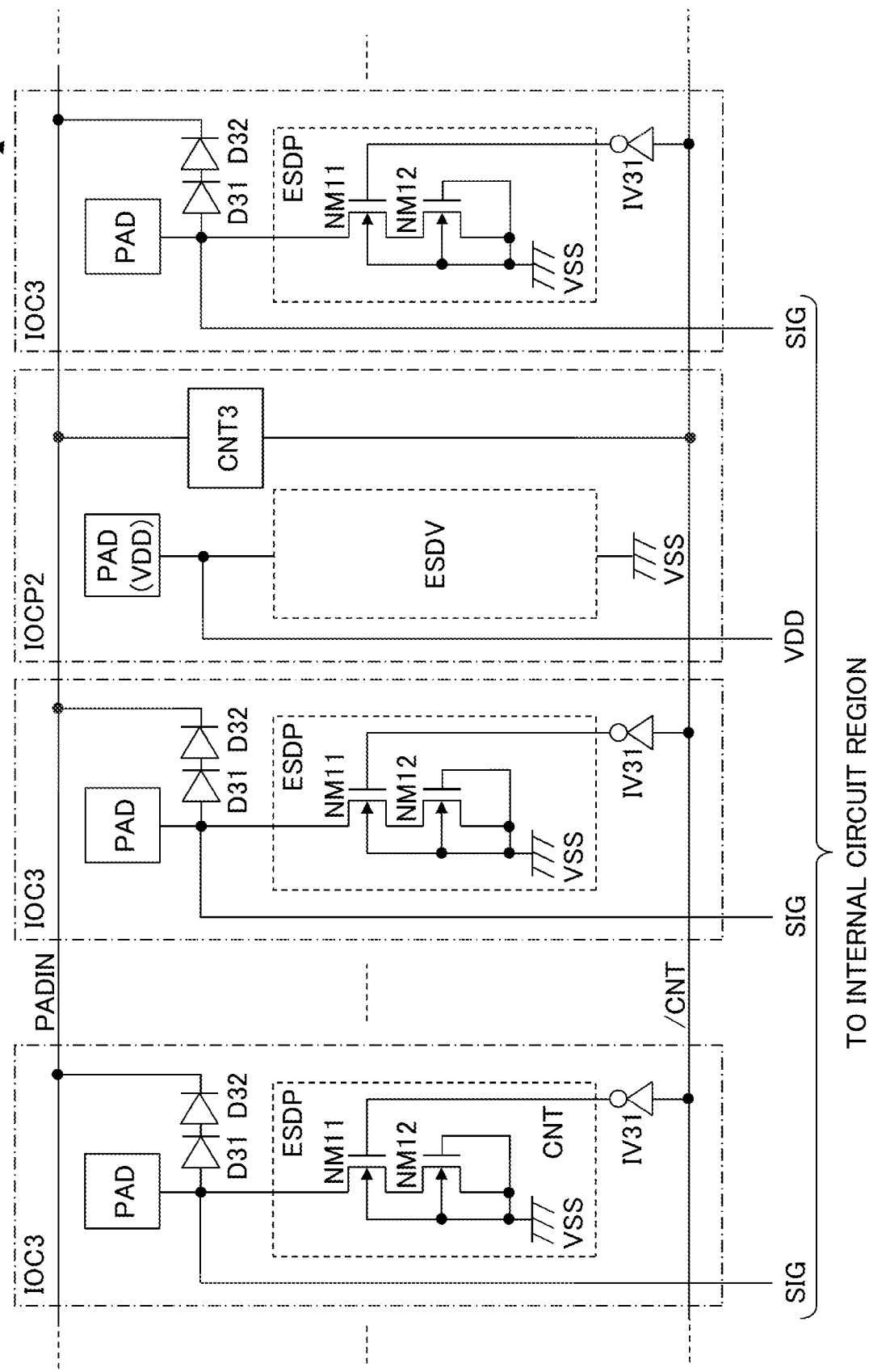
FIG. 4 is a circuit diagram illustrating an overview of a semiconductor device according to a third embodiment.

FIG. 4 illustrates an overview of a semiconductor device according to a third embodiment. A semiconductor device SEM illustrated in FIG. 4 has a configuration substantially the same as that of the semiconductor device SEM in FIG. 1, except that SEM includes an I/O cell IOC3 instead of the I/O cell IOC1 and an I/O cell IOCP2 instead of the I/O cell IOCP1. Note that the I/O cell IOCP2 may be arranged in place of at least one of the I/O cell IOCP1 in FIG. 1.

The I/O cell IOC3 has a configuration in which the control circuit CNT1 is removed from the I/O cell IOC1 in FIG. 2, and an inverter IV31 and diodes D31 and D32 are added. The diodes D31 and D32 are connected in series between the pad PAD and a node PADIN having their anodes arranged on the pad PAD side. The inverter IV31 outputs a control signal CNT having the logic level of a control signal/CNT inverted, to the gate of the transistor NM11 of protection circuit ESDP.

The I/O cell IOCP2 includes a control circuit CNT3 and a protection circuit ESDV for ESD. The I/O cell IOCP2 in FIG. 4 is an I/O cell for a power supply whose pad PAD is connected to the power supply wire VDD. The protection circuit ESDV is provided between the pad PAD connected to the power supply wire VDD and the ground wire VSS. Note that the I/O cell IOCP2 may be used in the I/O cell in which the pad PAD is connected to the ground wire VSS. In this case, the protection circuit ESDV of the I/O cell IOCP2 is provided between the power supply wire VDD and the pad PAD connected to the ground wire VSS.

The control circuit CNT3 is connected to the pad PAD of each of the I/O cells IOC3 via the node PADIN and the diodes D31 and D32 of a corresponding one of the multiple I/O cells IOC3. In addition, the control circuit CNT3 is connected to the gate of the transistor NM11 of each of the I/O cell IOC3 via the control signal line/CNT and the inverter IV31 of a corresponding one of the multiple I/O cells IOC3. An example of the control circuit CNT3 is illustrated in FIG. 5.

Figure 5:
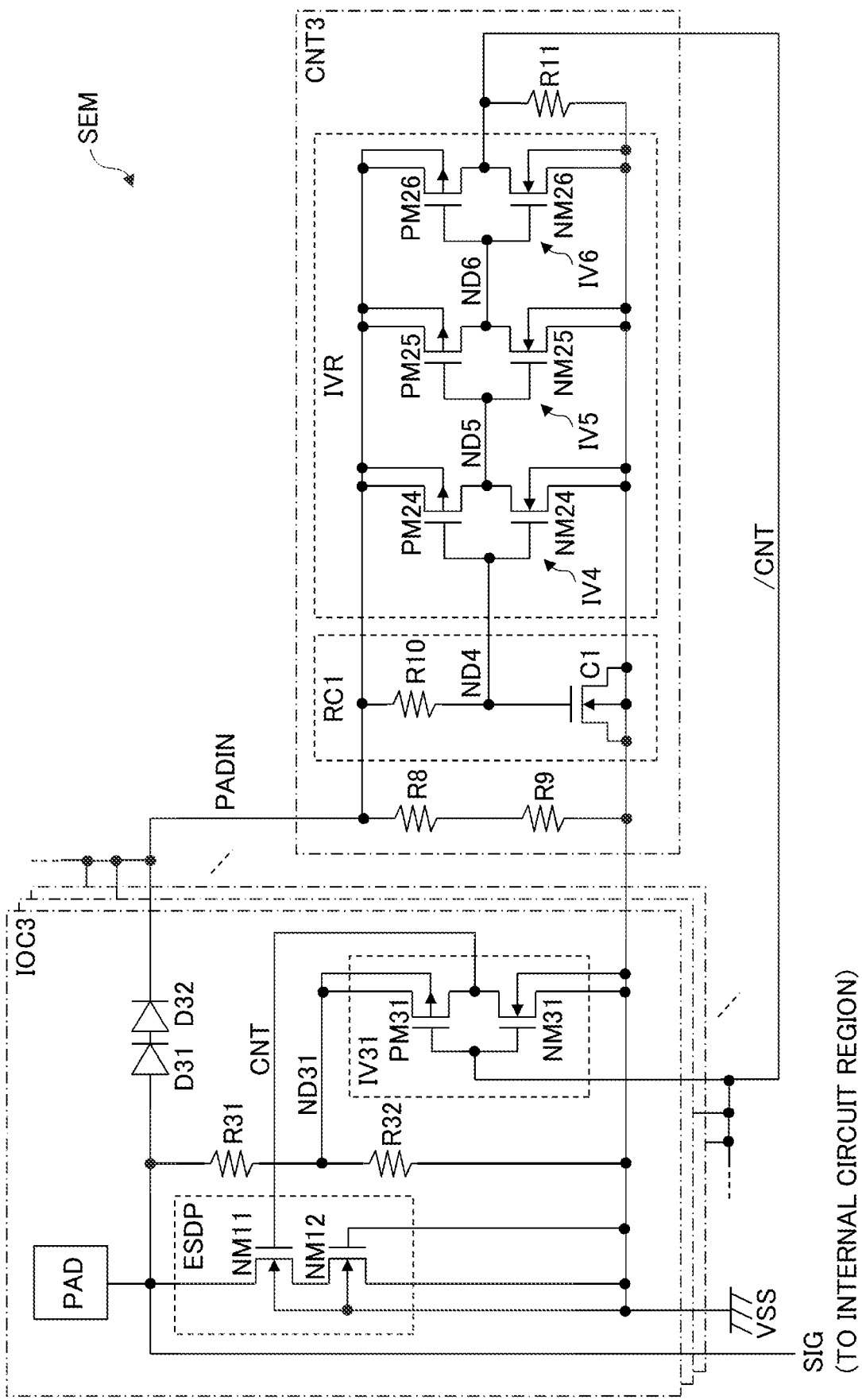
FIG. 5 is a circuit diagram illustrating an example of an I/O cell for a signal and a control circuit in FIG. 4.

FIG. 5 illustrates an example of the I/O cell IOC3 for a signal and the control circuit CNT3 in FIG. 4. In addition to the elements illustrated in FIG. 4, the I/O cell IOC3 includes resistive elements R31 and R32 connected in series between the pad PAD and the ground wire VSS. A node ND31 provided between the resistive elements R31 and R32 is connected to the power supply wire of the inverter IV31.

The inverter IV31 includes transistors PM31 and NM31 connected in series between the node ND31 and the ground wire VSS. The transistors PM31 and NM31, like the transistors NM11 and NM12, are designed to be a low withstand voltage type.

The division ratio by the resistive elements R31 and R32 is designed such that the voltage of the node ND31 when a signal SIG of the high level is supplied to the pad PAD is lower than or equal to the withstand voltages of the transistors PM31 and NM31. Accordingly, like the inverters IV1 and IV2 in FIG. 2, breakdown of the transistors PM31 and NM31 when a signal SIG of the high level is supplied to the pad PAD can be suppressed.

The control circuit CNT3 includes resistive elements R8, R9, and R11, an RC circuit RC1, and a series of inverters IVR. The RC circuit RC1 includes a resistive element R10 and a capacitive element C1 connected in series between the node PADIN and the ground wire VSS via a node ND4. For example, the capacitive element C1 is formed using the gate insulator film of an n-channel MOS transistor, like the capacitive element C1 in FIG. 2.

The series of inverters IVR includes CMOS (Complementary Metal Oxide Semiconductor) inverters IV4, IV5, and IV6 connected in series. The input and output of the inverter IV4 are connected to the node ND4 and the node ND5, respectively. The input and output of the inverter IV5 are connected to the node ND5 and the node ND6, respectively. The input and output of the inverter IV6 are connected to the node ND6 and the control signal line/CNT, respectively.

The inverter IV4 includes transistors PM24 and NM24 connected in series between the node PADIN and the ground wire VSS. The inverter IV5 includes transistors PM25 and NM25 connected in series between the node PADIN and the ground wire VSS. The inverter IV6 includes transistors PM26 and NM26 connected in series between the node PADIN and the ground wire VSS.

The resistive elements R8 and R9 are connected in series between the node PADIN and the ground wire VSS. In other words, the diodes D31 and D32 and the resistive elements R8 and R9 are connected in series between the pad PAD and the ground wire VSS. The resistance values of the resistive elements R8 and R9 are designed such that the voltage of the node PADIN when a signal SIG of the high level is supplied to the pad PAD is lower than or equal to the withstand voltage of the transistors PM24 to PM26 and NM24 to NM26 of the series of inverters IVR. Accordingly, like the inverters IV1 and IV2 in FIG. 2, breakdown of the transistors PM24 to PM26 and NM24 to NM26 when a signal SIG of the high level is supplied to the pad PAD can be suppressed.

A resistor R11 is connected between the control signal line/CNT and the ground wire VSS. The resistor R11 functions as a pull-down resistor that suppresses the level of the control signal/CNT from becoming unstable when the signal SIG supplied to the pad PAD changes from the low level to the high level.

The operations of the I/O cell IOC3 and the control circuit CNT3 when a signal SIG of the high level is supplied to the pad PAD and when a surge due to ESD is input into the pad PAD are substantially the same as the operations of the I/O cell IOC1 (control circuit CNT1) in FIG. 2.

For example, when the pad PAD is supplied with a signal SIG of the high level, the gate of the transistor NM11 of the protection circuit ESDP is supplied with the control signal CNT of the high level that is the same as the voltage of the node ND31 that is dropped from the high level of the pad PAD. Accordingly, the voltage between the drain and the gate of the transistor NM11 can be set to be lower than or equal to the withstand voltage of the transistor NM11, and breakdown of the transistor NM11 can be suppressed.

In addition, in the case where a positive surge due to ESD is input into the pad PAD, an ESD current flows from the pad PAD to the ground wire VSS due to a bipolar operation of the transistor NM11 of the protection circuit ESDP. Accordingly, the ESD current can be suppressed from flowing in the internal circuit region, and elements including transistors and the like installed in the internal circuit region can be protected from the surge. At this time, by outputting the control signal CNT of the low level to the gate of the transistor NM11 by the control circuit CNT3, the capability of the bipolar operation can be increased compared to the case of setting the gate of the transistor NM11 to the high level.

As above, also in this embodiment, the same effects as in the embodiments described above can be obtained. Further, in this embodiment, the control circuit CNT3 that controls the gate of the transistor NM11 of the protection circuit ESDP of the I/O cell IOC3, is commonly provided in each of the multiple I/O cells IOC3. Accordingly, one control circuit CNT3 can protect the low withstand voltage type transistors of the multiple I/O cells IOC3.

As above, the present disclosure has been described based on the respective embodiments; note that the present disclosure is not limited to the requirements set forth in the embodiments described above. These requirements can be changed within a scope not to impair the gist of the present disclosure, and can be suitably defined according to applications.

What is claimed is:

1. A semiconductor device comprising:
   an ESD protection circuit including a first n-channel MOS transistor and a second n-channel MOS transistor provided between a signal terminal and a ground wire; and
   a control circuit electrically connected to the signal terminal,
   wherein, while a signal of a high level is being supplied to the signal terminal, the control circuit outputs a first voltage dropped from a high-level voltage of the signal to a gate of the first n-channel MOS transistor, and in response to a surge due to ESD being input into the signal terminal, outputs a second voltage lower than the first voltage to the gate of the first n-channel MOS transistor,
   a drain of the first n-channel MOS transistor is connected to the signal terminal,
   a drain of the second n-channel MOS transistor is connected to a source of the first n-channel MOS transistor, and
   a source and a gate of the second n-channel MOS transistor is connected to the ground wire.

2. The semiconductor device as claimed in claim 1, wherein the control circuit includes,
   a RC circuit connected to the signal terminal,
   a buffer circuit having an input being connected to the RC circuit, and an output terminal being electrically connected to the gate of the first n-channel MOS transistor, and
   a voltage drop circuit configured to drop a voltage received at the signal terminal, and supply the dropped voltage to a power terminal of the buffer circuit.

3. The semiconductor device as claimed in claim 2, wherein the buffer circuit outputs a low level from the output terminal in response to receiving the high level at the input, and outputs the high level from the output terminal in response to receiving the low level at the input, and
   wherein the ESD protection circuit includes an inverter provided between the output terminal of the buffer circuit and the gate of the first n-channel MOS transistor.

4. The semiconductor device as claimed in claim 2, wherein the voltage drop circuit includes a diode and a resistive element connected in series between the signal terminal and the ground wire, and
   wherein a connection node between the diode and the resistive element is connected to the power terminal of the buffer circuit.

5. The semiconductor device as claimed in claim 4, wherein the control circuit is commonly provided in each of a plurality of instances of the ESD protection circuit, and
   wherein the output terminal of the buffer circuit is electrically connected to the gate of the first n-channel MOS transistors in said each of the plurality of instances of the ESD protection circuit.

6. The semiconductor device as claimed in claim 1, wherein a value of the high-level voltage of a signal input or output via the signal terminal is specified to be greater than a withstand voltage value of a transistor provided in the control circuit.

* * * * *